(12) United States Patent
Cao et al.

(10) Patent No.: US 11,410,453 B2
(45) Date of Patent: Aug. 9, 2022

(54) FLEXIBLE DISPLAY PANEL WITH FINGERPRINT IDENTIFICATION

(71) Applicant: Wuhan China Star Optoelectronics Semiconductor Display Technology Co., Ltd., Hubei (CN)

(72) Inventors: Haoran Cao, Hubei (CN); Pilgeun Chun, Hubei (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 18 days.

(21) Appl. No.: 17/253,138

(22) PCT Filed: Apr. 1, 2019

(86) PCT No.: PCT/CN2019/080751
§ 371 (c)(1),
(2) Date: Dec. 17, 2020

(87) PCT Pub. No.: WO2020/118976
PCT Pub. Date: Jun. 18, 2020

(65) Prior Publication Data
US 2021/0271844 A1   Sep. 2, 2021

(30) Foreign Application Priority Data
Dec. 14, 2018 (CN) .......................... 201811534037.7

(51) Int. Cl.
*H01L 27/32*   (2006.01)
*G06V 40/13*   (2022.01)
*H01L 51/00*   (2006.01)

(52) U.S. Cl.
CPC ........ *G06V 40/1318* (2022.01); *H01L 27/323* (2013.01); *H01L 27/3234* (2013.01);
(Continued)

(58) Field of Classification Search
CPC .. G06V 40/1318; G06V 40/13; H01L 27/323; H01L 27/3234; H01L 27/3244; H01L 51/0097; H01L 2251/5338
See application file for complete search history.

(56) References Cited

U.S. PATENT DOCUMENTS

2017/0220844 A1* 8/2017 Jones ................ G06V 40/13
2017/0286743 A1* 10/2017 Lee .................. G06V 40/1318

FOREIGN PATENT DOCUMENTS

CN   203982334   12/2014
CN   106886767   6/2017
(Continued)

*Primary Examiner* — Abdul-Samad A Adediran

(57) ABSTRACT

The present disclosure provides a flexible display screen panel with fingerprint identification and method thereof. The flexible display screen panel includes a polyimide (PI) substrate, wherein a first light-transmitting region is arranged on the PI substrate; a buffer layer arranged on the PI substrate; a functional layer arranged on the buffer layer; a touch layer arranged on the function layer; and an optical fingerprint identification module arranged under the first light-transmitting region. The light-transmitting region is arranged on the PI substrate and the light-transmitting region is designed into a concave lens configuration. The identification accuracy and the identification efficiency of the fingerprint for recognition by the optical fingerprint identification module are improved. The unlocking time is shortened and the user experience is improved. In addition, two light-transmitting regions are arranged on the PI substrate for unlocking the fingerprint of two fingers at one time.

7 Claims, 2 Drawing Sheets

(52) U.S. Cl.
CPC ...... *H01L 27/3244* (2013.01); *H01L 51/0097* (2013.01); *H01L 2251/5338* (2013.01)

(56) References Cited

FOREIGN PATENT DOCUMENTS

| | | |
|---|---|---|
| CN | 107870689 | 4/2018 |
| CN | 108885376 | 11/2018 |

\* cited by examiner

FLEXIBLE DISPLAY PANEL WITH FINGERPRINT IDENTIFICATION

RELATED APPLICATIONS

This application is a National Phase of PCT Patent Application No. PCT/CN2019/080751 having International filing date of Apr. 1, 2019, which claims the benefit of priority of Chinese Patent Application No. 201811534037.7 filed on Dec. 14, 2018. The contents of the above applications are all incorporated by reference as if fully set forth herein in their entirety.

FIELD AND BACKGROUND OF THE INVENTION

The present disclosure relates to a technical field of display devices, and more particularly to a flexible display panel with fingerprint identification.

A fingerprint identification module integrated into a display screen includes three kinds of an optical type, an ultrasonic type, and a capacitive type. The fingerprint identification module with the optical type is operated based on the refraction and reflection principle of the light. When fingers are placed on optical lens and the fingers are irradiated by a built-in light source, light is emitted to the triangular prism from the bottom and is emitted out through the prism. The refraction angles of the emitted light on the surface fingerprints of the fingers and the light reflected back from the surface fingerprint are different to distinguish the fingerprints. The fingerprint identification module with the ultrasonic type detects the distance difference between peaks and valleys by time difference of reflected waves and a fingerprint image is drawn according to the distance difference. The fingerprint identification module with the ultrasonic type uses a principle of a capacitive sensing mode integrated into a chip. When the fingerprint of the fingers presses the surface of the chip, an internal capacitive sensor generates a fingerprint image according to electric charge difference generated by the wave peak and the wave valley of the fingerprint.

For a fingerprint identification module with the optical type, it is required to keep relatively high transmittance on a light transmission path from the sensor to the fingerprint of the fingers. Because the thin film transistor liquid crystal display (TFT-LCD) with a backlight plate (opaque), the TFT-LCD is difficult to adopt an external optical fingerprint identification module. The active-matrix organic light-emitting diode (AMOLED) includes a self-luminous function, a bendable feature, high color gamut, high contrast ratio, relatively low power consumption, and light and thin feature, thereby becoming a mainstream configuration of a smart phone.

The flexible AMOLED panel is firstly coated with polyimide (PI) on a glass substrate, a upper film layer is formed thereon, and the glass substrate and the PI substrate are finally separated by a laser stripping technology to obtain the flexible AMOLED panel, thereby forming 3D edge of the panel and the folding screen.

However, the accuracy of the fingerprint identification of the flexible AMOLED panel is low, because the color of the PI substrate is light yellow and the light transmittance is low. Therefore, light emitted by the organic light-emitting layer is reflected at the fingerprint of the finger, such that more reflected light can be lost when the light passes through PI substrate with the light yellow and low transmittance in a reflection path. In other words, the reflected light received by the optical fingerprint identification module and passing through the PI substrate is smaller. When the accuracy of the fingerprint identification of the flexible AMOLED panel is low, the unlocking time of the display screen is increased, thereby decreasing user experience. Therefore, there is a need to provide a flexible display screen panel with a novel fingerprint identification to solve above-mentioned the problems.

SUMMARY OF THE INVENTION

The present disclosure aims to provide a flexible display screen panel with fingerprint identification to solve the problems of lower fingerprint identification accuracy of the fingerprint identification structure under the flexible display screen panel, long unlocking time, and user experience.

In order to solve above-mentioned problems, the present disclosure provides a flexible display screen panel with fingerprint identification, the flexible display screen panel comprising a polyimide (PI) substrate, wherein a first light-transmitting region is arranged on the PI substrate; a buffer layer arranged on the PI substrate; a functional layer arranged on the buffer layer; a touch layer arranged on the function layer; and an optical fingerprint identification module arranged under the first light-transmitting region.

In an embodiment of the flexible display screen panel with fingerprint identification, the function layer comprises a thin film transistor (TFT) array substrate arranged on the PI substrate; an organic light-emitting diode arranged on the TFT array substrate; and a packaging layer arranged on the organic light-emitting diode.

In an embodiment of the flexible display screen panel with fingerprint identification, the first light-transmitting region comprises a first light-incident surface that is an interface between the first light-transmitting region and the buffer layer, wherein the first light emitting surface is a first light emitting surface; and a first light emitting surface that is an interface between the first light-transmitting region and the optical fingerprint identification module.

In an embodiment of the flexible display screen panel with fingerprint identification, the first light-incident surface is a downward-concave arc-shaped surface.

In an embodiment of the flexible display screen panel with fingerprint identification, the first light-emitting surface is an upward-convex arc-shaped surface.

In an embodiment of the flexible display screen panel with fingerprint identification, the first light incident surface is formed by etching the buffer layer, and an etching mode is chemical etching.

In an embodiment of the flexible display screen panel with fingerprint identification, the first light-emitting surface is formed by etching the PI substrate, and an etching mode is laser etching.

In an embodiment of the flexible display screen panel with fingerprint identification, the first light-transmitting region is composed of a transparent material, wherein the transparent material is selected from a group consisting of transparent adhesive, polyethylene glycol terephthalate, and a film-state transparent polyimide.

In an embodiment of the flexible display screen panel with fingerprint identification, the PI substrate further comprises a second light-transmitting area.

In an embodiment of the flexible display screen panel with fingerprint identification, structures of the second light-transmitting region and the first light-transmitting region are the same.

The light-transmitting region is arranged on the PI substrate, such that more fingerprint reflected light can pass through the first light-transmitting region to reach the optical fingerprint identification module, thereby increasing identification accuracy and efficiency of the fingerprint recognition by the optical fingerprint identification module and improving user experience. Moreover, the light-transmitting region is designed into a concave lens configuration, such that the effect of expanding collected fingerprint shape is achieved, and therefore the accuracy and the recognition speed of the fingerprint identification are further improved. In addition, two light-transmitting regions are arranged on the PI substrate for unlocking the fingerprint of two fingers at one time.

BRIEF DESCRIPTION OF THE SEVERAL VIEWS OF THE DRAWINGS

The following embodiments refer to the accompanying drawings for exemplifying specific implementable embodiments of the present disclosure in a suitable computing environment. It should be noted that the exemplary described embodiments are configured to describe and understand the present disclosure, but the present disclosure is not limited thereto.

DESCRIPTION OF SPECIFIC EMBODIMENTS OF THE INVENTION

The following embodiments refer to the accompanying figures for exemplifying specific implementable embodiments of the present disclosure in a suitable environment. It should be noted that the exemplary described embodiments are configured to describe and understand the present disclosure, but the present disclosure is not limited thereto.

Directional terms, such as an upper side, a lower side, a front side, a back side, a left side, a right side, an inner side, an outer side, and a lateral side, mentioned in the present disclosure are only for reference.

Therefore, the directional terms are used for describing and understanding rather than limiting the present disclosure. In the figures, units having similar structures are used for the same reference numbers.

When specific components are described as being "on" another component, the component may be placed directly on the other component; there may also be an intermediate component disposed on the intermediate component, and the intermediate component being placed on another component. When a component is described as being "mounted to" or "connected to" another component, both may be understood as being "mounted" or "connected" directly, or one component being "mounted to" or "connected to" another component by an intermediate component.

Embodiment 1

Figure 1:
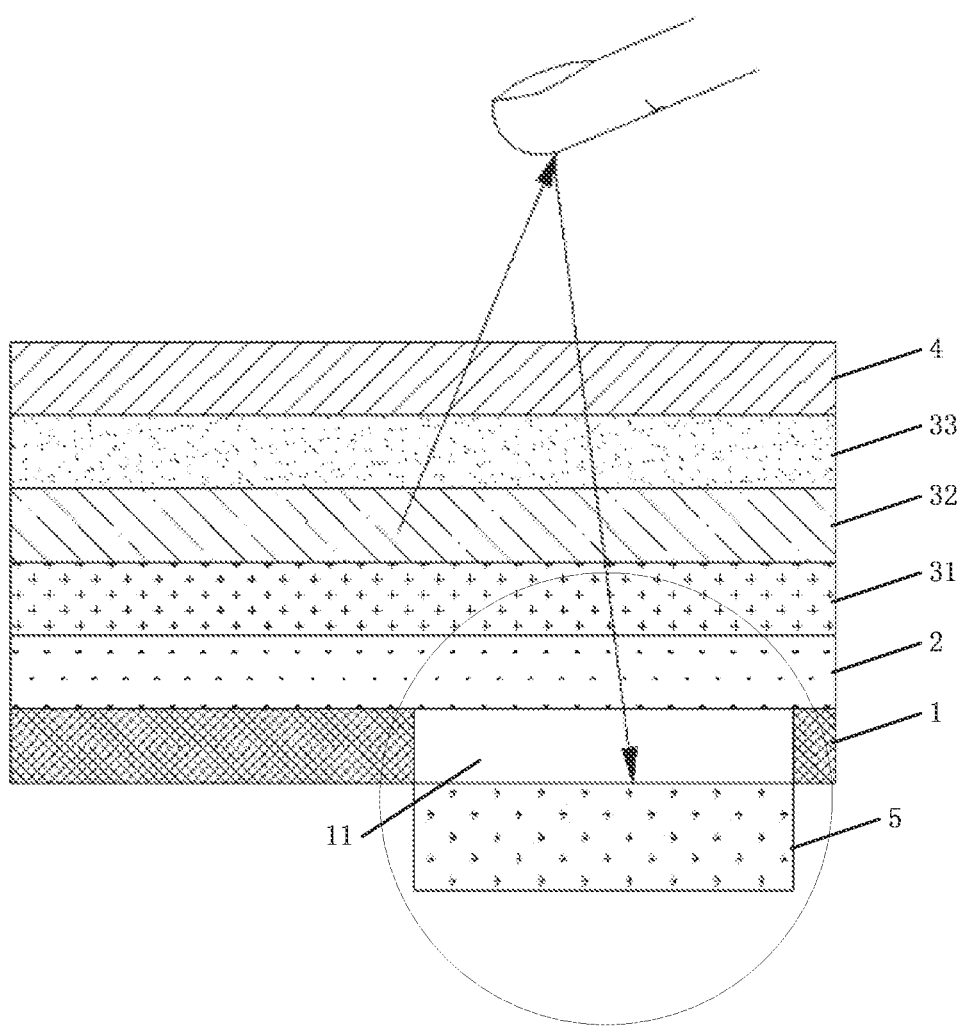
FIG. 1 is a schematic structural diagram of a flexible display screen panel with fingerprint identification according to an embodiment of the present disclosure.

As shown in FIG. 1, a flexible display panel with fingerprint identification includes a polyimide (PI) substrate 1, a buffer layer 2, a functional layer, a touch layer 4, and an optical fingerprint identification module 5 which are sequentially arranged, where a first light-transmitting region 11 is arranged on the PI substrate 1. The buffer layer 2 is arranged on the PI substrate 1. The functional layer is arranged on the buffer layer 2. The touch layer 4 is arranged on the function layer. The optical fingerprint identification module 5 is arranged under the first light transmission region 11. The function layer includes a thin film transistor (TFT) array substrate 31, an organic light-emitting diode 32, and a packaging layer 33 which are sequentially arranged. The TFT array substrate 31 is arranged on the PI substrate 1. The organic light-emitting diode 32 is arranged on the TFT array substrate 31. The packaging layer 33 is arranged on the organic light-emitting diode 32.

In an embodiment, when the fingerprint is placed on the touch control layer 4 for recognition and the light emitted by the functional layer are reflected at the fingerprint, the reflected light passes through the functional layer and the buffer layer 2 downwards to reach the first light-transmitting region 11 of the PI substrate 1, and penetrates through the first light-transmitting region 11, such that the optical fingerprint identification module 5 receives the reflected light for starting the fingerprint identification.

As shown in FIG. 1, the first light-transmitting region 11 of the flexible display panel with fingerprint identification includes a feature of better light transmittance, such that more fingerprint reflected light can pass through the first light-transmitting region 11 to reach the optical fingerprint identification module 5, thereby rapidly recognizing the fingerprint by the optical fingerprint identification module 5.

Figure 2:
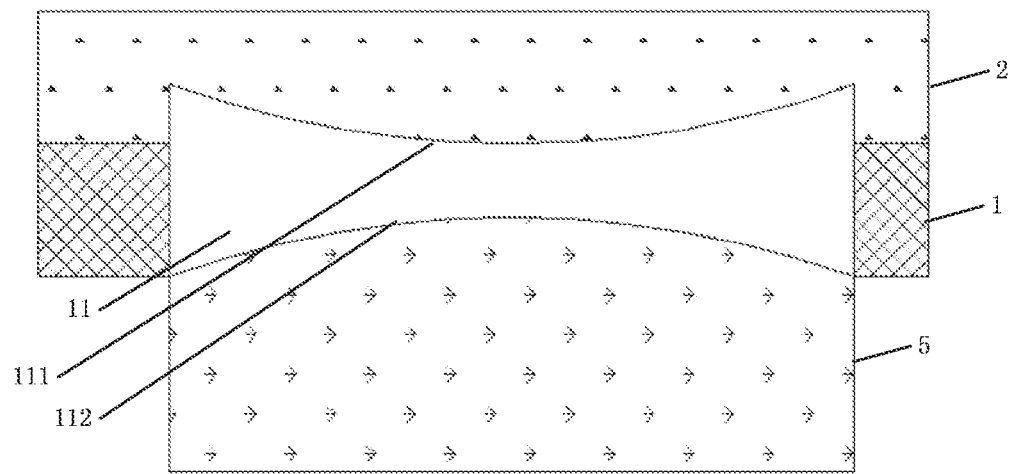
FIG. 2 is a partial enlarged view of the circle part of FIG. 1 according to an embodiment of the present disclosure.

In FIG. 2, it shows a partial enlarged view of the circle part of FIG. 1. The first light-transmitting region 11 includes a first light-incident surface 111 and a first light-emitting surface 112, and the first light-incident surface 111 is an interface between the first light-transmitting region 11 and the buffer layer 2. The first light-emitting surface 112 is an interface of the first light-transmitting region 11 and the optical fingerprint identification module 5.

In FIG. 2, it shows a partial enlarged view of the circle part of FIG. 1. In an embodiment, the first light-incident surface 111 is a downward-concave arc-shaped surface, and the first light-emitting surface 112 is an upward-convex arc-shaped surface.

In FIG. 2, it shows a partial enlarged view of the circle part of FIG. 1. The first light incident surface 111 is formed by etching a buffer layer 2. In an embodiment, an etching step can be a laser etching procedure or a chemical etching, but is not limited. The laser etching is an important step of laser process. In other words, the laser beam irradiates an opaque target material and the local surface of the target material is heated, melted, and vaporized due to the deposition of the laser energy, such that a vaporization substance is sprayed out at a high speed, a physical phase, such as plasma generation, is generated, and the surface of the target material is transferred to the vaporization substance. The laser etching procedure has the characteristics of clean, controllability, and wide application fields.

In FIG. 2, a partial enlarged view of the circle part of FIG. 1. The first light-emitting surface 112 is formed by etching the PI substrate 1. The etching step can be a chemical etching or a laser etching procedure, but is not limited. In an embodiment, the chemical etching is performed by exposing and developing to remove a protective film of an etching area, where the chemical solution contacts protective film and an effect of dissolving corrosion is achieved, such that the effect of downward-concave arc-shaped surface, upward-convex arc-shaped surface, or hollowed-out forming is formed.

Figure 3:
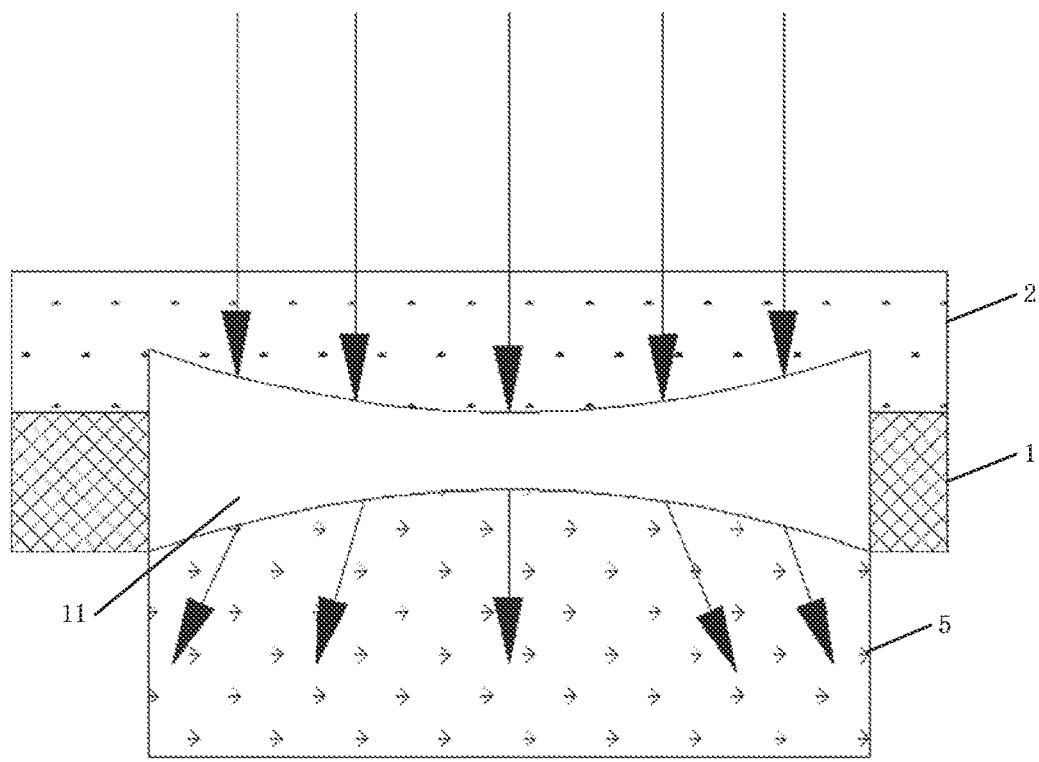
FIG. 3 is a light transmission diagram of a flexible display screen panel with fingerprint identification according to an embodiment of the present disclosure.

As shown in FIG. 3, FIG. 3 is a light transmission diagram of a flexible display screen panel with fingerprint identification. The first light-transmitting region 11 is designed as a concave lens. After the light reflected by the fingerprint for recognition enters the optical fingerprint identification module 5, the path of the light that enters the optical fingerprint identification module 5 is changed, such that the effect of expanding collected fingerprint shape is achieved, and therefore the accuracy and the recognition speed of the fingerprint identification are further improved.

As shown in FIG. 1, FIG. 2, and FIG. 3, the first light-transmitting region 11 is composed of a transparent material. The transparent material is transparent adhesive, polyethylene glycol terephthalate, and a film-state transparent polyimide. Therefore, the transmission capability of the reflected light can be improved, and the recognition capability of the optical fingerprint identification module 5 under the screen can be further improved.

Embodiment 2

Figure 4:
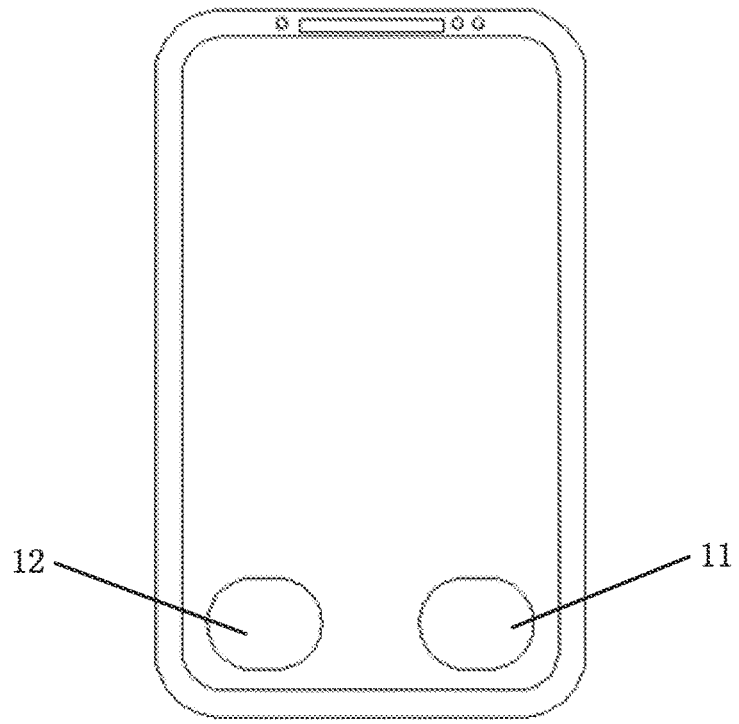
FIG. 4 is a schematic diagram of a flexible display screen panel with fingerprint identification according to another embodiment of the present disclosure.

As shown in FIG. 4, the second light-transmitting region 12 is arranged on the PI substrate 1 for unlocking the fingerprint of two fingers at one time. In another embodiment, if more light-transmitting region are arranged, unlocking speed and unlocking accuracy of the fingerprint can be improved more effectively.

As shown in FIG. 4, the structures of the second light-transmitting region 12 and the first light-transmitting region 11 are the same to reduce the manufacturing cost and the installation time, and save the production cost.

As is understood by a person skilled in the art, the foregoing preferred embodiments of the present disclosure are illustrative rather than limiting of the present disclosure. It is intended that they cover various modifications and similar arrangements be included within the spirit and scope of the present disclosure, the scope of which should be accorded the broadest interpretation so as to encompass all such modifications and similar structures.

What is claimed is:

1. A flexible display screen panel with fingerprint identification, the flexible display screen panel comprising:
    a polyimide (PI) substrate, wherein a first light-transmitting region is arranged on the PI substrate;
    a buffer layer arranged on the PI substrate;
    a functional layer arranged on the buffer layer;
    a touch layer arranged on the function layer; and
    an optical fingerprint identification module arranged under the first light-transmitting regions;
    wherein the first light-transmitting region comprises a first light-incident surface that is an interface between the first light-transmitting region and the buffer layer, and a first light-emitting surface that is an interface between the first light-transmitting region and the optical fingerprint identification module;
    wherein the first light-incident surface is a downward-concave arc-shaped surface located inside the first light-transmitting region, and the first light-emitting surface is an upward-convex arc-shaped surface located facing the first light-incident surface inside the first light-transmitting region.

2. The flexible display screen panel with fingerprint identification according to claim 1, wherein the function layer comprises:
    a thin film transistor (TFT) array substrate arranged on the PI substrate;
    an organic light-emitting diode arranged on the TFT array substrate; and
    a packaging layer arranged on the organic light-emitting diode.

3. The flexible display screen panel with fingerprint identification according to claim 1, wherein the first light-incident surface is formed by etching the buffer layer, and an etching mode is chemical etching.

4. The flexible display screen panel with fingerprint identification according to claim 1, wherein the first light-emitting surface is formed by etching the PI substrate, and an etching mode is laser etching.

5. The flexible display screen panel with fingerprint identification according to claim 1, wherein the first light-transmitting region is composed of a transparent material; and
    wherein the transparent material is selected from a group consisting of transparent adhesive, polyethylene glycol terephthalate, and a film-state transparent polyimide.

6. The flexible display screen panel with fingerprint identification according to claim 1, wherein the PI substrate further comprises a second light-transmitting area.

7. The flexible display screen panel with fingerprint identification according to claim 6, wherein structures of the second light-transmitting region and the first light-transmitting region are same.

\* \* \* \* \*